(12) United States Patent
Haba et al.

(10) Patent No.: US 9,425,167 B2
(45) Date of Patent: Aug. 23, 2016

(54) STACKABLE MICROELECTRONIC PACKAGE STRUCTURES

(71) Applicant: Invensas Corporation, San Jose, CA (US)

(72) Inventors: Belgacem Haba, Saratoga, CA (US); Kyong-Mo Bang, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/545,019

(22) Filed: Mar. 16, 2015

(65) Prior Publication Data

US 2015/0200183 A1    Jul. 16, 2015

Related U.S. Application Data

(60) Continuation of application No. 14/217,820, filed on Mar. 18, 2014, now Pat. No. 8,980,693, which is a division of application No. 13/346,167, filed on Jan. 9, 2012, now Pat. No. 8,680,684.

(51) Int. Cl.
*H01L 25/065* (2006.01)
*H01L 25/10* (2006.01)
(Continued)

(52) U.S. Cl.
CPC ........ *H01L 25/0655* (2013.01); *B81C 1/00301* (2013.01); *H01L 23/3107* (2013.01); *H01L 24/20* (2013.01); *H01L 24/49* (2013.01); *H01L 24/96* (2013.01); *H01L 25/0652* (2013.01); *H01L 25/105* (2013.01); *H01L 23/13* (2013.01);
(Continued)

(58) Field of Classification Search
CPC ................. H01L 2924/00; H01L 2924/00014; H01L 2224/73265; H01L 2224/32225; H01L 2224/48227; H01L 2924/15311; H01L 2924/0002; H01L 2224/32145; H01L 2224/97; H01L 2924/181; H01L 2224/16225
See application file for complete search history.

(56) References Cited

U.S. PATENT DOCUMENTS 5,579,207 A    11/1996 Hayden et al.
6,577,013 B1   6/2003 Glenn et al.
(Continued)

OTHER PUBLICATIONS

Partial International Search Report dated Apr. 8, 2013 for PCT/US2012/070477.
(Continued)

*Primary Examiner* — Roy Potter
*Assistant Examiner* — Paul Patton
(74) *Attorney, Agent, or Firm* — Lerner, David, Littenberg, Krumholz & Mentlik, LLP

(57) ABSTRACT

A microelectronic assembly includes a first microelectronic package having a substrate with first and second opposed surfaces and substrate contacts thereon. The first package further includes first and second microelectronic elements, each having element contacts electrically connected with the substrate contacts and being spaced apart from one another on the first surface so as to provide an interconnect area of the first surface between the first and second microelectronic elements. A plurality of package terminals at the second surface are electrically interconnected with the substrate contacts for connecting the package with a component external thereto. A plurality of stack terminals are exposed at the first surface in the interconnect area for connecting the package with a component overlying the first surface of the substrate. The assembly further includes a second microelectronic package overlying the first microelectronic package and having terminals joined to the stack terminals of the first microelectronic package.

20 Claims, 13 Drawing Sheets

(51) Int. Cl.
*B81C 1/00* (2006.01)
*H01L 23/31* (2006.01)
*H01L 23/00* (2006.01)
*H01L 23/13* (2006.01)
*H01L 23/367* (2006.01)

(52) U.S. Cl.
CPC ........... *H01L 23/3128* (2013.01); *H01L 23/367* (2013.01); *H01L 24/13* (2013.01); *H01L 24/16* (2013.01); *H01L 24/48* (2013.01); *H01L 2224/12105* (2013.01); *H01L 2224/131* (2013.01); *H01L 2224/16225* (2013.01); *H01L 2224/16227* (2013.01); *H01L 2224/221* (2013.01); *H01L 2224/4824* (2013.01); *H01L 2224/48091* (2013.01); *H01L 2224/48106* (2013.01); *H01L 2224/48228* (2013.01); *H01L 2224/4911* (2013.01); *H01L 2224/49109* (2013.01); *H01L 2224/96* (2013.01); *H01L 2225/0651* (2013.01); *H01L 2225/0652* (2013.01); *H01L 2225/06524* (2013.01); *H01L 2225/06548* (2013.01); *H01L 2225/1023* (2013.01); *H01L 2225/1035* (2013.01); *H01L 2225/1058* (2013.01); *H01L 2225/1094* (2013.01); *H01L 2924/00014* (2013.01); *H01L 2924/15311* (2013.01); *H01L 2924/15331* (2013.01); *H01L 2924/18161* (2013.01); *H01L 2924/18165* (2013.01); *H01L 2924/19107* (2013.01)

(56) References Cited

U.S. PATENT DOCUMENTS

| | | | |
|---|---|---|---|
| 8,525,314 B2 | 9/2013 | Haba et al. | |
| 8,678,280 B2 | 3/2014 | Suzuki | |
| 8,680,684 B2 * | 3/2014 | Haba | H01L 24/20 257/774 |
| 8,980,693 B2 * | 3/2015 | Haba | H01L 24/20 438/107 |
| 2001/0008794 A1 | 7/2001 | Akagawa | |
| 2009/0155960 A1 | 6/2009 | Chow et al. | |
| 2011/0079924 A1 | 4/2011 | Suh | |

OTHER PUBLICATIONS

International Search Report and Written Opinion for PCT/US2012/070477 dated Jun. 3, 2013.
U.S. Appl. No. 61/542,488, filed Oct. 3, 2011.
U.S. Appl. No. 61/542,553, filed filed Oct. 3, 2011.
U.S. Appl. No. 61/506,889, filed Jul. 12, 2011.

* cited by examiner

STACKABLE MICROELECTRONIC PACKAGE STRUCTURES

CROSS-REFERENCE TO RELATED APPLICATIONS

The present application is a continuation of U.S. patent application Ser. No. 14/217,820, filed Mar. 18, 2014, issuing as U.S. Pat. No. 8,980,693 on Mar. 17, 2015, which is a divisional of U.S. patent application Ser. No. 13/346,167, filed Jan. 9, 2012, issued as U.S. Pat. No. 8,680,684 on Mar. 25, 2014, the disclosures of all of which are incorporated herein by reference.

BACKGROUND OF THE INVENTION

The present invention relates to improved microelectronic packages and to methods of making such packages.

Microelectronic elements generally comprise a thin slab of a semiconductor material, such as silicon or gallium arsenide, commonly called a die or a semiconductor chip. Semiconductor chips typically embody large numbers of active or passive devices which can be electrically connected together internally to perform circuit function, e.g., as an integrated circuit. Semiconductor chips are commonly provided as individual, prepackaged units. In some unit designs, the semiconductor chip is mounted to a substrate or chip carrier.

Despite the advances that have been made in semiconductor packaging, there is still a need for improvements which may help to reduce the overall size of the package, while enhancing electrical interconnection reliability. These attributes of the present invention are achieved by the construction of the microelectronic packages and methods of making the microelectronic packages as described hereinafter.

BRIEF SUMMARY OF THE INVENTION

An aspect of the present disclosure relates to a microelectronic assembly including a first microelectronic package having a substrate with first and second opposed surfaces and substrate contacts thereon. The first package further includes first and second microelectronic elements, each having element contacts electrically connected with the substrate contacts, the first and second microelectronic elements being spaced apart from one another on the first surface so as to provide an interconnect area of the first surface between the first and second microelectronic elements. A plurality of package terminals at the second surface are electrically interconnected with the substrate contacts for connecting the package with a component external to the package. A plurality of stack terminals are exposed at the first surface in the interconnect area for connecting the package with a component overlying the first surface of the substrate. The assembly further includes a second microelectronic package overlying the first microelectronic package and having terminals joined to the stack terminals of the first microelectronic package.

The package terminals and the stack terminals can overlie each other in respective electrically connected pairs. In an example, the package terminals and the stack terminals can be opposite ends of conductive vias through the substrate.

Additional ones of the stack terminals can be at the first surface of the substrate in a portion thereof that is outside of the interconnect area. In an embodiment, the first microelectronic package can further include third and fourth microelectronic elements spaced on opposite sides of the interconnect area between the first and second microelectronic elements. In such an embodiment, the additional ones of the stack terminals can be in a corner region of the substrate bounded by adjacent ones of the microelectronic elements. Additionally or alternatively, at least some of the stack terminals can be connected with both of the first and second microelectronic elements. In such an example, at least some of the stack terminals that are connected with both of the first and second microelectronic elements can be configured to carry at least one of command, address, and timing signals.

The first microelectronic package can further include a molded encapsulant layer overlying at least a portion of the first surface of the substrate, and at least portions of the first conductive interconnects can comprise first conductive vias extending through the molded encapsulant layer to exposed ends. In an embodiment, contact-bearing faces of the first and second microelectronic elements can face the substrate, the substrate contacts including substrate contacts exposed at the second surface, and the element contacts can be connected with the substrate contacts by wire bonds.

The microelectronic assembly can include substrate contacts exposed at the first surface. In such an embodiment, the element contacts of the first and second first microelectronic elements can face the substrate contacts exposed at the first surface and can be joined thereto.

The second microelectronic package can include a third microelectronic element mounted on a second substrate. In such an embodiment, the terminals of the second package can be on the second substrate and electrically connected with the third microelectronic element. In an example, the second microelectronic package can include a substrate having first and second spaced apart surfaces and third and fourth microelectronic elements mounted on the second surface thereof. The third and fourth microelectronic elements can be spaced apart on the substrate of the second package to define an interconnect area therein, and the terminals can be exposed at the second surface of the substrate of the second package within the interconnect area. The substrate of the second package can further include a window extending therethrough between the first and second surfaces thereof, and the terminals of the second package can be joined to the stack terminals of the first package by wire bonds that extend through the window. In a further embodiment, the substrate of the first package can define a peripheral area surrounding at least one of the first and second microelectronic elements, additional stack terminals being located in the peripheral area. The peripheral area can surround at least one of the third and fourth microelectronic elements and a peripheral edge can bound the peripheral area. Additional terminals can be located in the peripheral area thereof, and at least some of the additional stack terminals of the first package can be joined with at least some of the additional terminals of the second package by wire bonds that extend past the peripheral edge of the substrate of the second package.

A third microelectronic package can overlie the first microelectronic package and can have terminals joined to the stack terminals of the first microelectronic package. Further, the microelectronic assembly can include a circuit panel with circuit contacts exposed at a surface thereof. The package terminals of the first microelectronic package can be electrically connected with the circuit contacts. The second microelectronic package terminals can be at least one of package terminals or stack terminals. The stack terminals of the first package can be electrically connected with the package terminals of the second package. Further, the stack terminals of the first and second packages can be electrically connected.

The microelectronic assembly can further include a heat spreader between the first and second microelectronic packages. The heat spreader can have an aperture formed therethrough that overlies at least a portion of the interconnect area. The stack terminals of the second microelectronic package can be connected with the stack terminals of the first microelectronic package through the aperture. The heat spreader can be a first heat spreader, in an embodiment of an assembly that further includes a second heat spreader, the first heat spreader being disposed on a first side of the interconnect area and the second heat spreader being disposed on a second side of the interconnect area. A gap can be defined between the first and second heat spreaders, and the stack terminals of the second microelectronic package can be connected with the stack terminals of the first microelectronic package through the gap.

Another aspect of the present disclosure relates to a microelectronic assembly including a first microelectronic package having first and second microelectronic elements. Each microelectronic element has front faces and back faces thereof and element contacts exposed at the respective front faces. The first and second microelectronic elements are laterally spaced apart from one another so as to provide an interconnect area therebetween. The first package further has a dielectric layer having a surface overlying the front faces of the first and second microelectronic elements and facing away from the front faces of the microelectronic elements. The dielectric layer further has a second surface opposite the first surface. A plurality of package terminals are exposed at the first surface of the dielectric layer and are electrically connected with the element contacts through traces extending along the dielectric layer and first metallized vias extending from the traces and contacting the element contacts. A plurality of stack terminals are exposed at the second surface of the dielectric layer and electrically connected with the package terminals for connecting the package with a component overlying the second surface of the dielectric layer. The assembly further includes a second microelectronic package overlying the first microelectronic package and having terminals joined to the stack terminals of the first microelectronic package.

In an example, the first package can further include a molded encapsulation layer at least partially surrounding the first and second microelectronic elements within the interconnect area and defining a surface thereof overlying the second surface of the dielectric layer. Conductive interconnects can be electrically connected with the stack terminals and having end surfaces exposed at the surface of the molded encapsulation layer.

Yet another aspect of the present disclosure relates to a microelectronic assembly including a first package, having a substrate with first and second opposed surfaces. The first package further includes first and second microelectronic elements each having element contacts electrically connected with corresponding substrate contacts on the first surface. The first and second microelectronic elements are spaced apart from one another on the first surface so as to provide an interconnect area of the first surface between the first and second microelectronic elements. A plurality of package terminals at the second surface are electrically interconnected with the substrate contacts for connecting the package with a component external to the package. A plurality of stack terminals exposed at the first surface of the substrate in the interconnect area are electrically connected with at least some of the package terminals. The assembly further includes a second microelectronic package overlying the first microelectronic package and having terminals. A plurality of conductive interconnects are joined between the stack terminals of the first microelectronic package and the terminals of the second microelectronic package.

The second microelectronic package can further have a second dielectric layer having first and second opposed surfaces and at least one microelectronic element mounted on the first surface of the dielectric layer.

A microelectronic assembly according to another embodiment of the present disclosure includes a first package having a substrate having first and second opposed surfaces and four microelectronic elements each having element contacts electrically connected with corresponding substrate contacts on the first surface. The microelectronic elements are arranged on the first surface so as to define an interconnect area of the first surface surrounded by the microelectronic elements. A plurality of package terminals at the second surface are electrically interconnected with the substrate contacts for connecting the package with a component external to the package. A plurality of stack terminals at the first surface in the interconnect area are electrically connected with the package terminals. The assembly further includes second microelectronic package overlying the first microelectronic package and having terminals. Conductive interconnects are joined between the stack terminals of the first microelectronic package and the terminals of the second microelectronic package. Each of the microelectronic elements can include a peripheral edge adjacent to the interconnect area such that the interior interconnect area is defined as a rectangular area. At least some of the first conductive elements can be electrically connected with at least two of the first microelectronic elements.

Another aspect of the present disclosure relates to a microelectronic assembly including a first package, having a substrate with first and second opposed surfaces. The first package also includes first and second microelectronic elements each having element contacts electrically connected with corresponding substrate contacts on the first surface, the first and second microelectronic elements being spaced apart from one another on the first surface so as to provide an interconnect area of the first surface between the first and second microelectronic elements. A plurality of contact pads have surfaces exposed at the second surface of the substrate, the surfaces of the contact pads defining package terminals electrically interconnected with the substrate contacts for connecting the package with a component external to the package. A molded encapsulant layer overlies at least a portion of the first surface of the substrate and defines an encapsulant surface. The assembly further includes a second microelectronic package bonded to the encapsulant surface and having terminals facing the encapsulant surface. A plurality of conductive vias extend at least through the molded encapsulant layer and connect the contact pads of the first microelectronic package and the terminals of the second microelectronic package.

The conductive vias can further extend through the contact pads of the first package in electrical contact therewith. The second microelectronic package can further include a substrate having first and second spaced apart surfaces. The second surface can be bonded to the encapsulant surface, and the terminals of the second package can be surfaces of conductive pads exposed at the second surface of the substrate. The conductive vias can further extend through the conductive pads of the second package in electrical contact therewith.

A system according to another aspect of the present disclosure can include a microelectronic assembly according to any of the embodiments discussed above and one or more other electronic components electrically connected to the microelectronic assembly.

A further aspect of the present disclosure relates to a method for making a microelectronic assembly. The method includes assembling a first microelectronic package with a second microelectronic package, the second microelectronic package overlying the first microelectronic package and having terminals thereon. The first microelectronic package includes a substrate having first and second opposed surfaces and substrate contacts thereon. The first package further includes first and second microelectronic elements, each having element contacts electrically connected with the substrate contacts. The first and second microelectronic elements are spaced apart from one another on the first surface so as to provide an interconnect area of the first surface between the first and second microelectronic elements. A plurality of package terminals at the second surface electrically interconnect with the substrate contacts for connecting the package with a component external to the package. A plurality of stack terminals are exposed at the first surface in the interconnect area for connecting the package with a component overlying the first surface of the substrate. The method further includes connecting the terminals of the second microelectronic package with the stack terminals of the first microelectronic package to form an electrical connection therebetween.

In an embodiment, the step of connecting the terminals of the second microelectronic package with the stack terminals of the first microelectronic package includes joining the package terminals to exposed ends of interconnects on an encapsulant layer of the first microelectronic package overlying the first surface of the substrate at least in the interconnect area thereof. In such an example, the interconnects can be joined to the stack terminals opposite the exposed ends thereof. In another embodiment, the step of connecting the terminals of the second microelectronic package with the stack terminals of the first microelectronic package can includes depositing conductive bond material masses into holes within an encapsulant layer of the first microelectronic package overlying the first surface of the substrate at least in the interconnect area. In such an embodiment, the stack terminals can be exposed at a surface of the encapsulant layer within the holes, and the conductive bond material masses can be joined to the terminals of the second package and the stack terminals of the first package.

In a further embodiment, the step of connecting the terminals of the second microelectronic package with the stack terminals of the first microelectronic package can includes forming a plurality of holes through at least an encapsulant of the first microelectronic package overlying the first surface of the substrate in at least the interconnect area thereof. The plurality of holes can be aligned with respective ones of the stack terminals at first ends thereof and with corresponding ones of the terminals of the second package at second ends thereof. Such a method can further include filling the holes with a conductive material in contact with the stack terminals of the first microelectronic package and the package terminals of the second package. The holes can be further formed through the substrate of the first package and through the respective stack terminals thereof. Alternatively, the holes can be further formed through a substrate of the second package and through the corresponding terminals thereof.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

DETAILED DESCRIPTION

Figure 1:
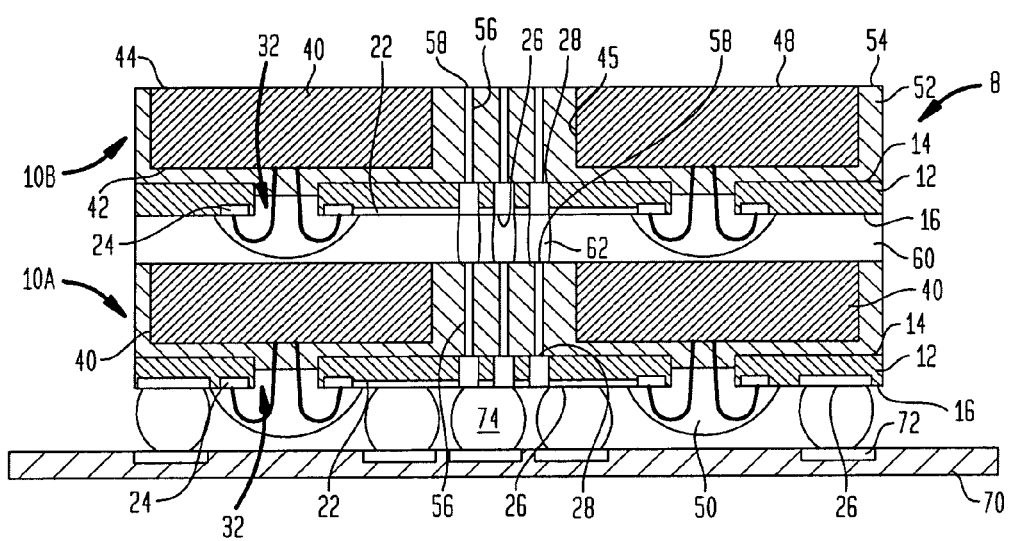
FIG. 1 is a sectional view of an assembly including microelectronic packages according to an embodiment of the present disclosure.

Turning now to the figures, where like reference numbers are used to indicate similar features, FIG. 1 shows a microelectronic assembly 8 of microelectronic packages 10A and 10B on a circuit panel 70. In the embodiment shown, packages 10A and 10B are substantially identical and each includes a plurality of microelectronic elements 40 mounted on the front face 14 of a substrate 12. In one example, each microelectronic element may be or include a semiconductor chip embodying a plurality of active circuit elements, e.g. semiconductor devices, which can be electrically configured as an integrated circuit, for example. In another example, each microelectronic element can include a plurality of passive circuit elements such as capacitors, inductors or resistors, which in some cases may be embodied in a semiconductor chip, either as only passibe devices, or together with active circuit elements, i.e. active devices. In the embodiment shown, each package 10A and 10B includes two microelectronic elements 40, but in other embodiments a package (such as those discussed below) can include more than two microelectronic elements such as three, four, or more.

Figure 1A:
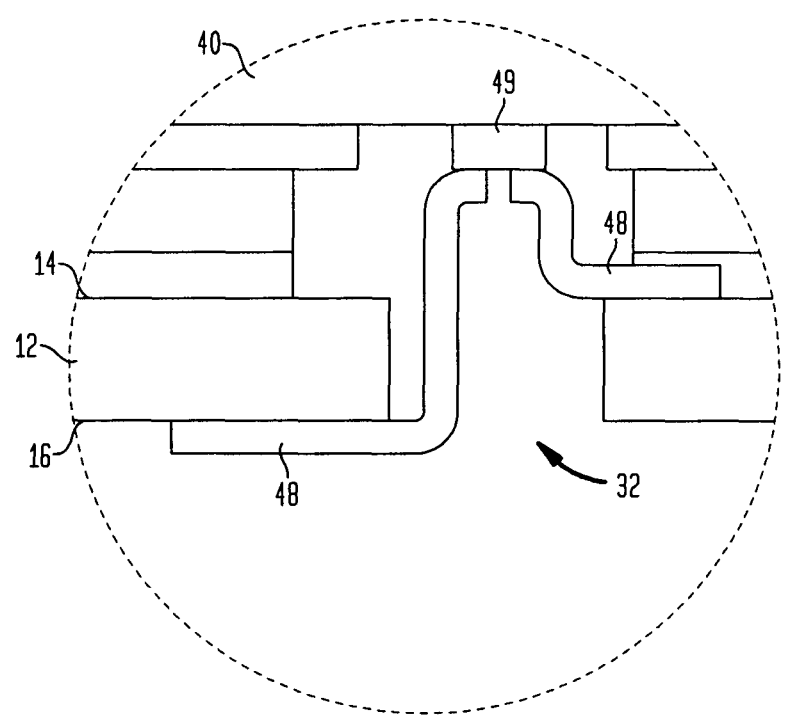
FIG. 1A is a sectional view of a portion of an assembly in accordance with an alternative embodiment of the present disclosure.

In the exemplary embodiment of FIG. 1, the microelectronic elements 40 are mounted on respective substrates in a face-down wire bond configuration. In this configuration, the microelectronic elements 40 are mounted with their front faces 42 facing the front face 14 of substrate 12. Element contacts 46 are exposed at front face of the microelectronic element 40 and are electrically connected with substrate wiring 22 that can include traces or contact pads either formed on or at least partially embedded in substrate 12. In the embodiment shown, the element contacts 46 are connected with the substrate wiring 22 by wire bonds 48 that pass through a window 32 in substrate 12. Although only a pair of wire bonds 48 is shown in FIG. 1, a plurality of wire bond pairs can extend along a row (See FIG. 15) and can pass through a window that is elongated to accept the multiple wire bond pairs. An encapsulant 50 can surround and protect wire bonds 48 in the area of window 32 and along portions thereof that extend outside of substrate 12 beyond the back surface 16 thereof. A molded dielectric layer 52 can at least partially surround microelectronic elements 40 including the edges 45 thereof and, in the face-down arrangement of FIG. 1, front face 42. Molded dielectric layer 52 can further bond microelectronic elements 40 to front face 14 of substrate 12. Molded dielectric layer 52 can define a surface 54 that can be substantially flush with back faces 44 of microelectronic elements 40 or can overlie back faces 44 to fully encapsulate microelectronic elements 40. Alternatively, as seen in FIG. 1A, some or all of the leads may be beam leads 137 which extend in a direction parallel to a surface 123 or 124 of the second substrate 120 and have portions aligned with aperture 126 and are joined to the contacts 112 of the first microelectronic element 102.

Substrate wiring 22 can include a plurality of package terminals 26 exposed at the back surface 16 of substrate 12. Package terminals 26 can be electrically connected with either or both microelectronic elements 40 of the package 10A or 10B and can further be interconnected with each other. Package terminals 26 can be available for use in connecting package 10A or 10B with a component external to that package 10A, 10B. For example, package terminals 26 in package 10A can be used to connect package 10A with circuit contacts 72 exposed at a surface of a circuit panel 70 that can be a printed circuit board ("PCB") or the like. The package terminals 26 of package 10B illustrate another example, in which package terminals 26 can be used to electrically connect with another package such as package 10A through structures of the package 10A, 10B that are discussed in greater detail below.

Microelectronic elements 40 are arranged along their respective substrates 12 in package 10A, 10B such that they are spaced apart on the first surface 14 to define an interconnect area 18 therebetween. In the embodiment shown in FIG. 1, the microelectronic elements 40 are arranged such that respective edge surfaces 45 thereof face and are substantially parallel to each other in a spaced-apart manner to define interconnect area 18 therebetween. It is not necessary, however for edge surfaces 45 to be parallel. In the embodiment shown interconnect area 18 can be bounded on two sides by the edges 45 of the microelectronic elements 40 and on the remaining two sides by edges of substrate 12. In other embodiments, interconnect area 18 can be considered bounded by an imaginary boundary extending between the outsides of the microelectronic elements 40. In embodiments with, for example, four microelectronic elements 40, the interconnect area 18 can be bounded on four sides by edges 45 of the individual microelectronic elements 40. In embodiments with more than four microelectronic elements, the interconnect area can be fully enclosed by the microelectronic elements, for example, on as many sides as there are microelectronic elements.

A plurality of stack terminals 28 are arranged within interconnect area 18 exposed as front surface 14 of substrate 12. The term "exposed at", as used herein does not refer to any specific means of attachment for stack terminals onto substrate 12 or any relative position therebetween. Rather, it indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric. Stack terminals 28 can be an array of individual terminals 28 that can include various rows or columns thereof. Other alternative arrangements of terminals 28 are also possible, including those with only two stack terminals 28 or with more than two terminals in various locations selected based on connection with other elements of package 10A or 10B. Stack terminals 28 can be a part of or can otherwise be connected with substrate wiring 22 such that stack terminals 28 can be interconnected with the microelectronic elements 40 of the same package 10A or 10B, with other stack terminals 28 or with package terminals 26.

Stack terminals 28 can be used to connect the associated package 10A or 10B with an external component that overlies front surface 14 of substrate 12. In one example, a plurality of interconnect elements 56 can be connected with stack terminals 28 and extend upwardly therefrom to end surfaces 58 thereof that can be exposed at surface 54 of molded dielectric layer 52. Interconnects 56 can be pins, posts, masses of bond metal or other conductive material, such as may include solder or a metal such as copper, gold, silver, tin, bismuth, indium, aluminum, nickel, etc. In the embodiment shown interconnects 56 are in the form of pins that extend away from front surface 14 of substrate 12 and extend through the molded dielectric layer 52. In such an embodiment, end surfaces 58 can form terminals exposed at surface 54 for interconnection with another component. In other embodiments, end surfaces 58 can be covered by contacts that are connected therewith to provide a terminal with a larger surface area than that of end surfaces 58 themselves.

As shown in FIG. 1, package 10B is mounted over package 10A, which can be done for example, using adhesive layer 60 that can be formed from a dielectric material such as epoxy or another curable material that can be positioned between surface 54 of package 10A and second surface 16 of the substrate 12 of package 10B. Masses of conductive material or a bond metal such as solder or the like, as described above, can connect the end surfaces 58 of the interconnects 56 of package 10A with the package terminals 26 of package 10B. This arrangement, thusly, provides a connection between stack terminals 28 of package 10A with package terminals 26 of package 10B, which can facilitate a number of further connections throughout the assembly 8. For example, this arrangement can provide a connection between either or both of the microelectronic elements 40 of package 10B with circuit panel 70 and, accordingly, any other components connected therewith. In another example, either or both of the microelectronic components 40 of package 10B with either or both of the microelectronic components of package 10A. The particular connections facilitated by such a connection can be made by adapting the substrate wiring 22 within each package 10A and 10B, including the particular connection made to the individual stack terminals 28.

A method for making a microelectronic assembly 8 such as that shown in FIG. 1 can include making or forming microelectronic packages 10A and 10B in the configurations described above separately. Packages 10A and 10B can then be aligned with each other, such that the corresponding package terminals 26 of package 10B align with the corresponding interconnects 56 of package 10A. The corresponding package terminals 26 of package 10B can then be electrically connected with the ends 58 of their respective interconnects 56 by joining together using, for example a conductive bonding material such as solder or the like in the form of masses 62. Adhesive layer 60 can then be injected or otherwise deposited between facing surfaces 16 and 54 and around the bonding metal masses 62 to secure packages 10A and 10B together.

In package 10A, some package terminals 26 and stack terminals 28 may directly overlie one another and can be electrically connected by a via 30 that extends through substrate 12. In the specific embodiment shown, a via 30 can be exposed at ends thereof on front surface 14 and back surface 16 such that the respective ends thereof are, respectively, the stack terminals 28 and the package terminals 26. Other embodiments are possible, including those in which contact pads overlie via 30 to form stack terminals 28 and package terminals 26. As illustrated by package 10A, vias 30 can be connected with substrate wiring 22 that extends along back surface 16 and includes package terminals that are displaced in one or more lateral directions from vias 30. A similar arrangement is possible wherein the substrate wiring 22 extends along front surface 14 and includes stack terminals 28 that are displaced from vias 30. Embodiments of a package such as package 10A that includes displaced package terminals 26 can also overlie another package (such as in the place of package 10B) and such displacement can compensate for different spatial placement of interconnects 56 in different packages or can redistribute the particular connections.

Figure 2:
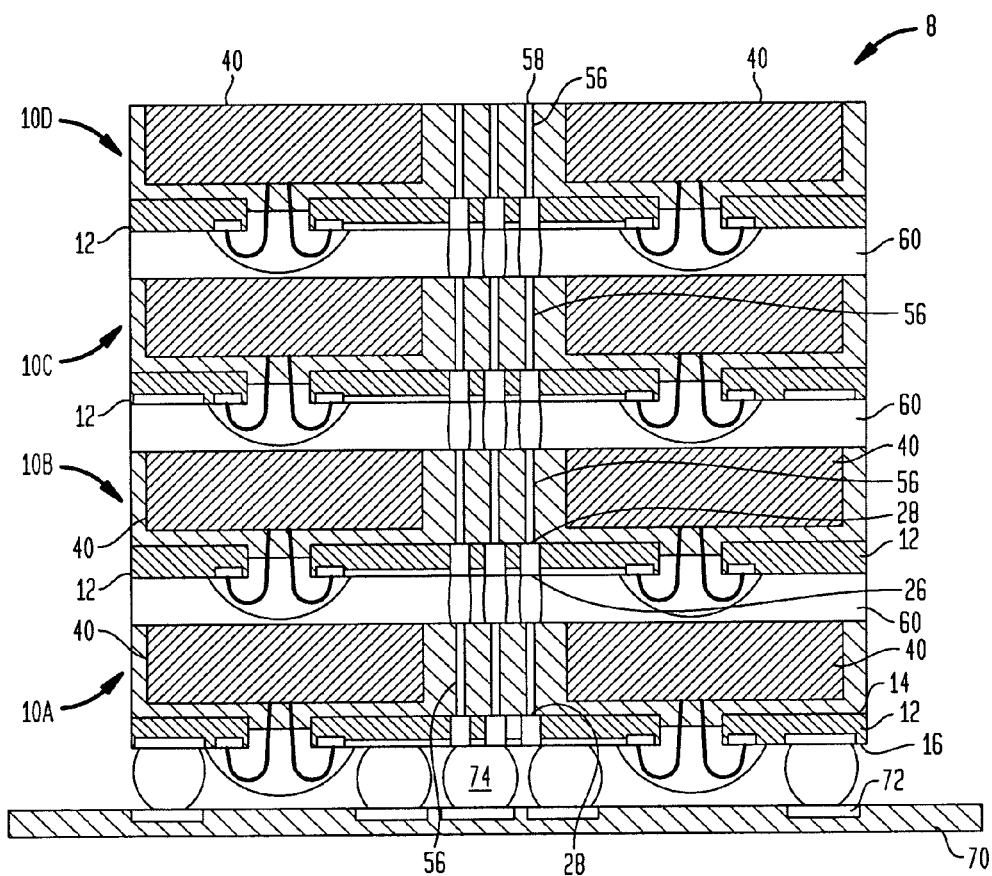
FIG. 2 is a sectional view of a further assembly including additional microelectronic packages as shown in FIG. 1.

As shown in FIG. 2, additional microelectronic packages, such as packages 10C and 10D can be included in an assembly 8. In the embodiment shown, packages 10C and 10D are similar in structure to package 10B such that the package terminals 26 of package 10C can be connected with the interconnect 56 end surfaces 58 of package 10B. Similarly, the package terminals 26 of package 10D can be connected with the interconnect 56 end surfaces 58 of package 10C. In both instances the packages are bonded together using adhesive layers 62 and the package terminals 26 can be connected with the end surfaces 58 of interconnects 56 using bonding metal masses 62. As in the embodiment of FIG. 1, the interconnection between packages 10A,10B,10C,10D can achieve a number of different interconnections between assembly elements. For example, the microelectronic elements 40 of packages 100 and 10D can connect through packages 10A and 10B to circuit panel 70. Further, any of the microelectronic elements 40 within assembly 8 can connect with any of the remaining microelectronic elements 40 through the interconnects 56 of any intervening packages.

A method for making a package 8 as shown in FIG. 2 can be similar to the method described above for making the package 8 of FIG. 1 with additional, similar steps included to attach additional packages 10C and 10D therewith.

Figure 3A:
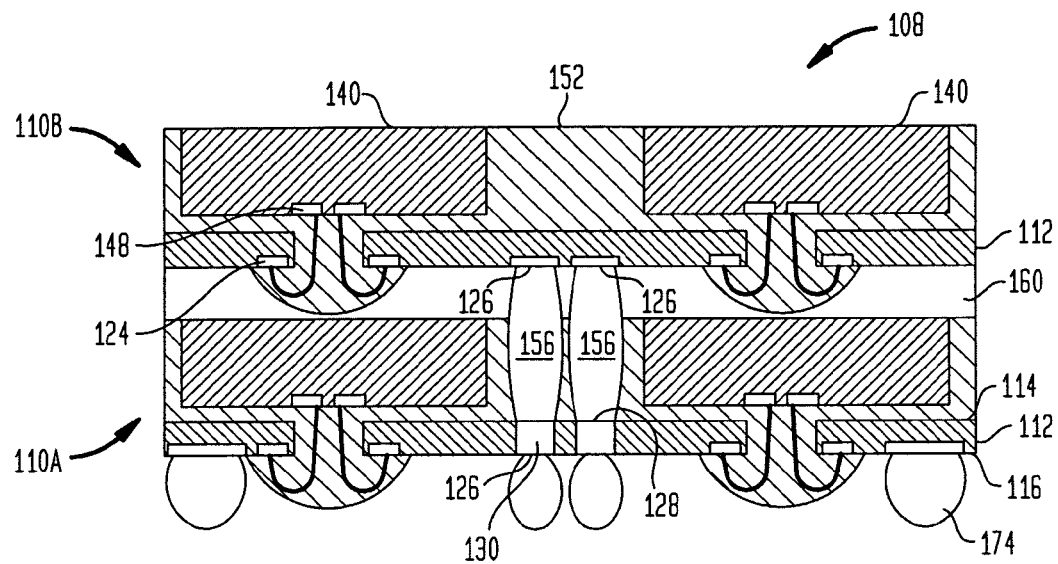
FIGS. 3A-3C are sectional views of alternative assemblies incorporating alternative microelectronic packages.
Figure 3B:
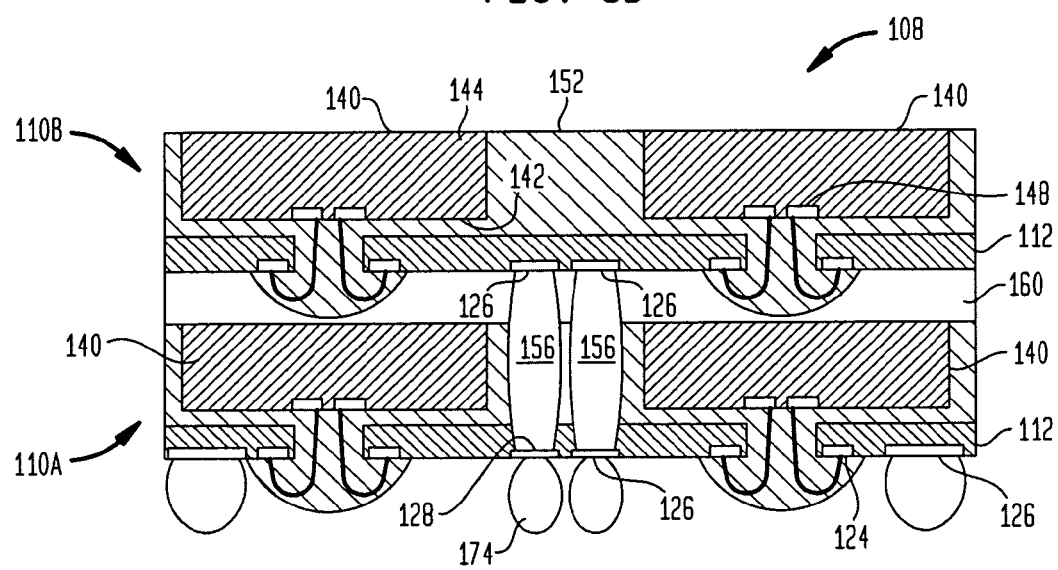
Figure 3C:
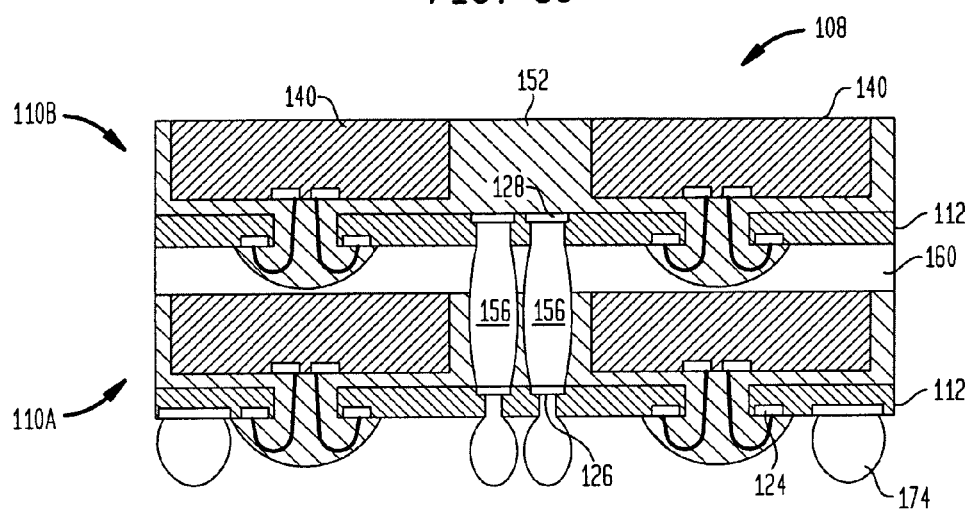

A number of other types of packages can be connected in such a manner using stack terminals in an interconnect area between microelectronic elements. Further a number of different connections to such stack terminals to external package terminals are also possible. In the examples shown in FIGS. 3A-3C, packages 110A and 110B are similar in structure to packages 10A and 10B, respectively, as shown in FIG. 1. In the embodiments of FIGS. 3A-3C, however, interconnects 156 are in the form of conductive masses, e.g. of a bonding metal, e.g. solder, tin, indium, gold, or combinations thereof, or other conductive bond material such as conductive paste, a conductive matrix material, amont others. In the example shown in FIG. 3C, the bond metal interconnects 156 extend all the way from stack terminals 128 of package 110A to package terminals 126 of package 110B. In such an embodiment, holes can be made in the molded dielectric layer 152 of package 110A to expose stack terminals 128 on surface 154. These holes can also extend through adhesive layer 160 in cases where adhesive layer 160 is formed before assembly with package 110B. Otherwise bonding metal, such as solder, can be deposited in such holes in contact with stack terminals 128 and package 110B can be assembled with package 110A and can interconnects 156 can be connected with package terminals 126 by reflowing the bonding metal. in one example, the adhesive layer 160 can then be injected between packages 110A and 110B and around exposed portions of the interconnects 156.

In the example of FIG. 3B, which is a variation of FIG. 3A, the stack terminals 128 and package terminals 126 are opposing surfaces of a contact pad 134 that is positioned adjacent the second surface 116 of substrate 112 in package 110A. As shown, the stack terminals 128 are exposed at first surface 114 of substrate 112 by openings 136 in substrate 112. In such an embodiment the bond metal interconnects 156 can further extend into the openings 136 in substrate 112 to join with stack terminals 128. FIG. 3C shows a further variation of the example of FIG. 3B in which the contact pads 134 are adjacent to first surface 114 of substrate 112 of package 110A. Package terminals 126 are exposed at second surface 116 by openings 136 in substrate 112. Solder balls 174 extend into openings 136 to connect with package terminals 126 for connection with an external component, as discussed above. Package 110B in FIG. 3C includes similar terminal structures as in package 110A. Bond metal interconnects 156 extend through openings 136 in substrate 112 of package 110B to connect with package terminals 126 thereof. In a method for making microelectronic packages 108, as shown in FIGS. 3A-3C, openings 136 can be included in package 110A prior to assembly with package 110B. Interconnect masses 156 can be included in openings 136 when package 110A is provided for assembly with package 110B. Masses 156 can then be heated to re-flow the bonding material for joining with package terminals 126 of package 110B. Alternatively, openings 136 can be left unfilled prior to assembly, at which point bonding metal can be deposited therein in a flowable state and can be further joined with package terminals 126 of package 10B. In a further alternative, openings 136 can be filled with bond metal interconnects 136 that are substantially even with surface 154 of molded dielectric 152. At assembly additional bonding metal can be added thereto and joined with package terminals 126 of package 110B.

Figure 4:
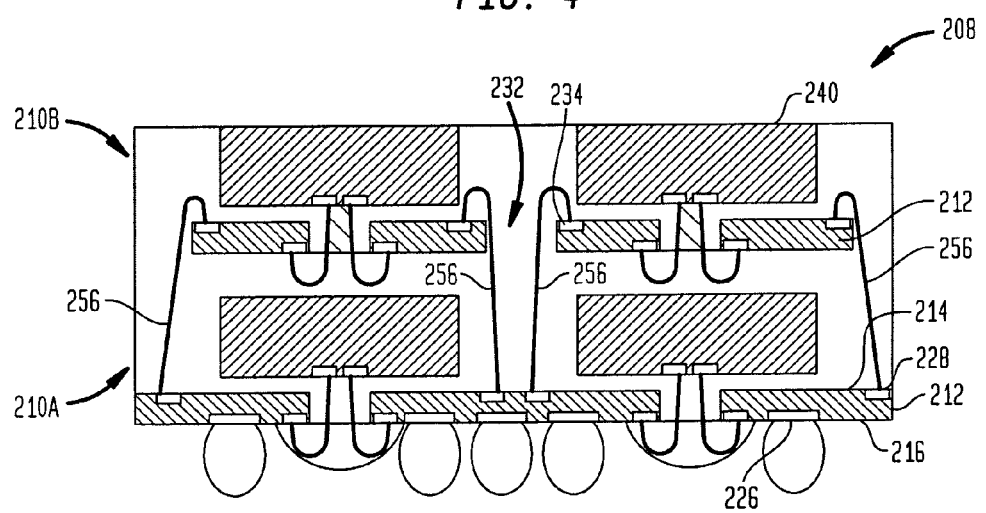
FIG. 4 is a sectional view of an alternative assembly of alternative microelectronic packages.

FIG. 4 shows a further alternative arrangement wherein a window 219 is formed through substrate 212 of package 210B such that the interconnects 256 can be in the form of wire bonds that connect stack terminals 228 of package 210A directly to stack terminals 228 of package 210B. In such an embodiment, the substrate wiring 222 of package 210B can connect between stack terminals 228 and the wire bonds 248 that are on the opposite face 216 from stack terminals 228. In some cases a single molded dielectric 250 can be formed at once which encapsulates the microelectronic elements 240 and the wire bonds 248 that connect microelectronic elements 240 to substrate wiring 222 and the interconnect wire bonds 256. As further shown in FIG. 4 additional stack terminals 226 can be exposed at first surface 214 of substrate 212 of package 210A in a peripheral area outside of the microelectronic elements 240. Similarly, additional stack terminals 228 can be exposed at the first surface 214 of substrate 212 of package 210B such that additional wire bond interconnects 256 can connect between the stack terminals 228 of packages 210A and 210B in the peripheral areas thereof. Additional examples of assemblies incorporating wire bonds through substrate windows to interconnect packages are described in co-pending, commonly-owned U.S. patent application Ser. Nos. 11/666,975 and 13/216,415, the disclosures of which are incorporated by reference herein in their entireties.

Figure 5A:
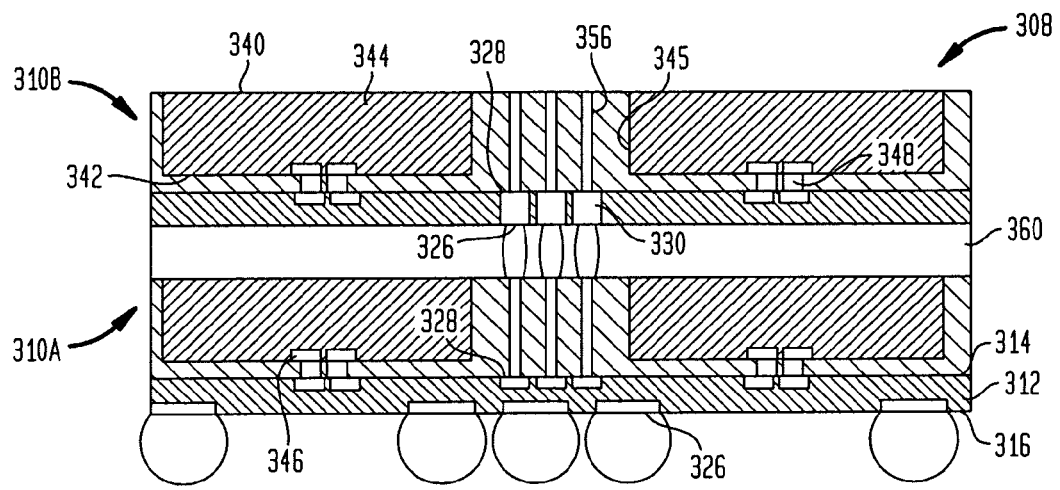
FIGS. 5A and 5B are sectional views of further alternative assemblies of alternative microelectronic packages.
Figure 5B:
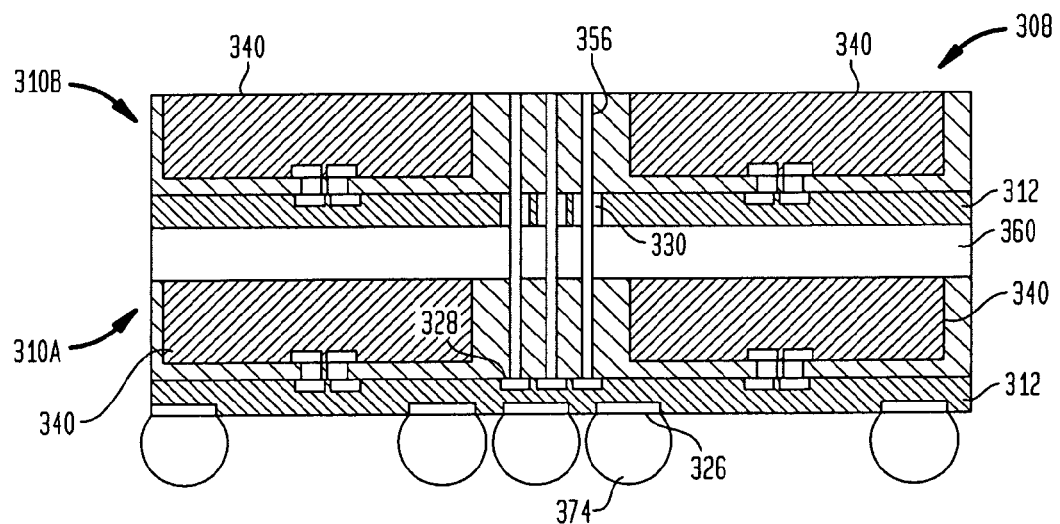

In further variations shown in FIGS. 5A and 5B, packages 310A and 310B can include microelectronic elements 340 that include element contacts 346 on the front face 342 thereof. Such microelectronic elements 340 are flip-chip bonded on substrates 312 such that element contacts 346 are connected to substrate wiring 322, including substrate contacts on the first surface 314 of substrate 312 by solder balls 348. The example of FIG. 5B further shows interconnects 356 in the form of metalized vias that extend through the vias 330 (or other similar structures) that define package terminals 326 and stack terminals 328 of package 310B to electrically connect therewith. The vias 356 further extend through molded dielectric 352 of package 310A and adhesive layer 360 to connect with stack terminals 328 of package 310A. In the example shown in FIG. 5B, vias further extend through molded dielectric 352 of package 310B such that vias 356 can be made by first forming corresponding openings through package 310B, including molded dielectric 352, stack terminals 328, package terminals 326 and any structure (such as the remainder of vias 330 or any portion of substrate 312) therebetween. Such openings are further formed through adhesive layer 360 and through molded dielectric 352 of package 310A. In some embodiments, the openings can also extend through stack terminals 328 and any associated structure such as vias 330. The openings are then filled with a conductive material such as copper or another wiring metal discussed herein. Such conductive metals can be deposited in openings by plating or the like. Alternatively, depending on the size of the openings and other factors including the thicknesses of the respective packages 310A and 310B, a conductive paste or bonding metal can be deposited in the openings to achieve the desired electrical connection. The vias 356 discussed with respect to FIG. 5B for connection between packages 310A and 310B can be used to form similar connections in the other examples of packages and assemblies thereof discussed herein.

Packages of the types described herein can be assembled with additional packages of similar types by connecting with either the package terminals or the stack terminals of such additional packages. In an example, packages of any of the types described herein can be mounted to each other in a face-to-face arrangement such as those shown in FIGS. 6 and 7. For example, in FIG. 6, packages 410A and 410B are positioned such that their respective dielectric surfaces 454 face each other and such that interconnect 456 end surfaces 458 are mutually aligned. Solder balls 462 can electronically connect the aligning interconnect 456 end surfaces 458 and an adhesive layer 460 can affix the two packages 410A and 410B. In a similar example, two packages can be attached back-to-back with solder balls connecting facing and aligning package terminals with an adhesive layer between facing back surfaces of respective package substrates. These examples can further be combined to assemble two sets of face-to-face bonded packages, such as packages 410A and 410B in FIG. 6 together. FIG. 7 shows a variation of the embodiment of FIG. 6 wherein a heat spreader 464 is disposed between packages 410A and 410B. Heat spreader 464 includes a window 466 therein through which interconnects 456 can pass. In anther example, heat spreader 464 can be two discrete heat spreaders 464, with one being disposed on each side of interconnect area 418. In such an embodiment, window 466 can be in the form of a gap defined between the two separate heat spreaders 464.

Figure 8:
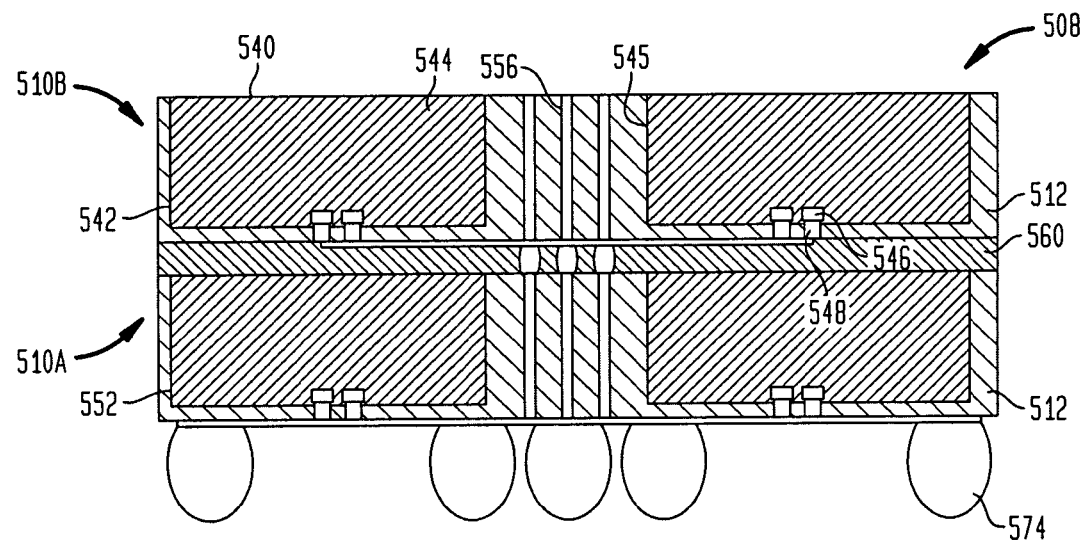
FIGS. 8-10 are sectional views of various assemblies of further alternative microelectronic packages according to further embodiments of the present disclosure.

Similar stack terminal arrangements can also be incorporated into multiple die arrangements in wafer-level packages. As shown in FIG. 8, packages 510A and 510B are both wafer level packages including two microelectronic elements 540. In this case, the substrate can be omitted such that the microelectronic packages 510A and 510B can be in form of a microelectronic elements 540 having packaging structure which includes an electrically conductive redistribution layer overlying the front faces 542 of the microelectronic elements 540. The redistribution layer has electrically conductive metallized vias 530 extending through a dielectric layer 538 of the package to contacts 546 of the microelectronic elements The redistribution layer includes package terminals 526 and traces electrically connected with the terminals 526, such that the terminals are electrically connected with the contacts 546, such as through the metallized vias 536 or through metallized vias 536 and electrically conductive traces. In the particular embodiment of FIG. 8, where package terminals 526 and stack terminals 528 are disposed on areas of the dielectric layer 538 which extend beyond one or more edges of the microelectronic elements 540, such as in interconnect area 518, the packages 510A and 510B can further be referred to as "fan-out wafer-level packages". Stack terminals 528 and package terminals 526 can be opposing surfaces of contact pads 534 that are incorporated in the redistribution circuitry 522 of each wafer level package 510A,510B within dielectric layer 538.

Figure 9:
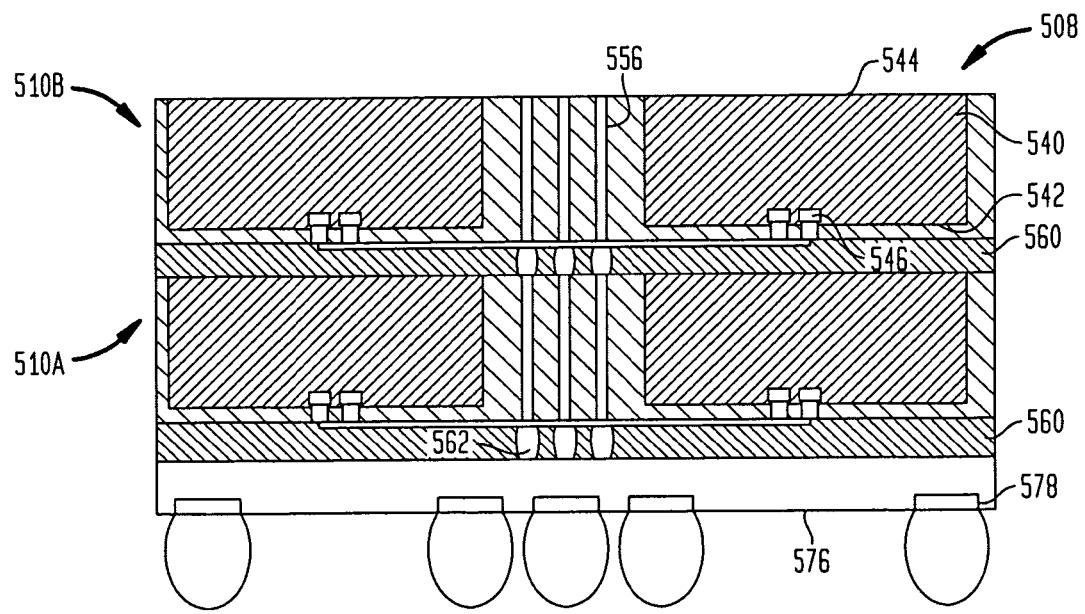
Figure 10:
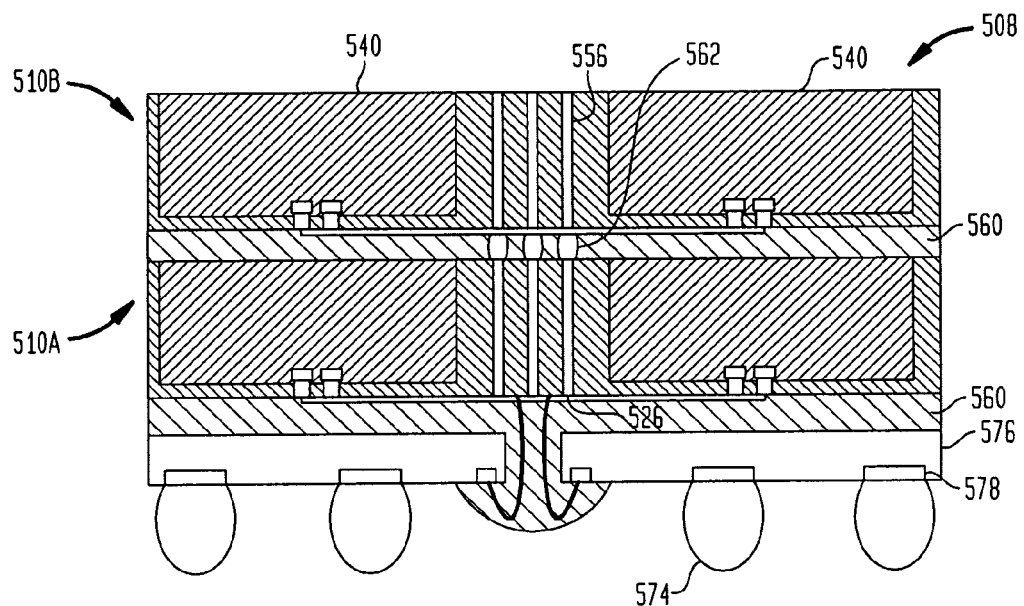

As in the embodiment of FIG. 1, interconnects 556 such as pins or the like can extend through molded dielectric 552 and, if necessary through dielectric layer 538, to end surfaces 558 thereof that are exposed on surface 554. This structure allows package 510B to be assembled over package 510A with the package terminals of package 510B connected with interconnect end surfaces 558. As described above, this connection configuration facilitates a number of different particular connections between the components of the packages 510A and 510E and connection therewith to external components, such as by connection of package terminals 526 of package 510A to circuit contacts of a PCB or the like. Such a connection can be achieved, as shown in FIG. 8 by bonding package terminals 526 of package 510A, for example, directly to circuit contacts 572. Alternatively, as shown in FIG. 9, a package substrate 576 can be included in assembly 508 that connects to package terminals 526 of package 510A via solder balls 562. Package substrate 576 can then connect to circuit contacts 572 by solder balls 574 connected to package contacts 576. In an alternative example, shown in FIG. 10, package terminals 526 of package 510A can be wire bonded to wiring within package substrate 576 that connects to package contacts 578.

Figure 6:
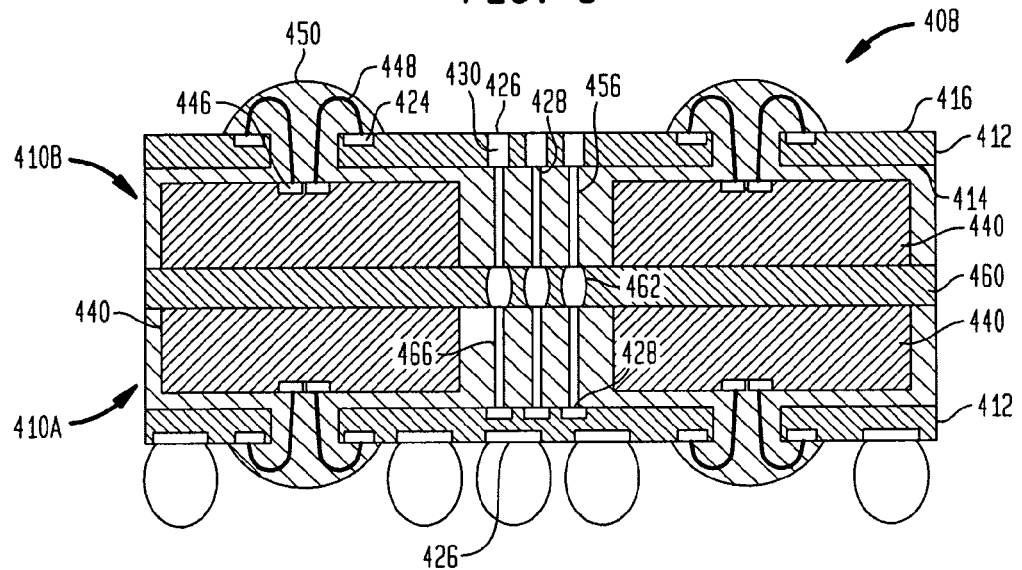
FIG. 6 is an alternative assembly including microelectronic packages of the type shown in FIG. 1.
Figure 7:
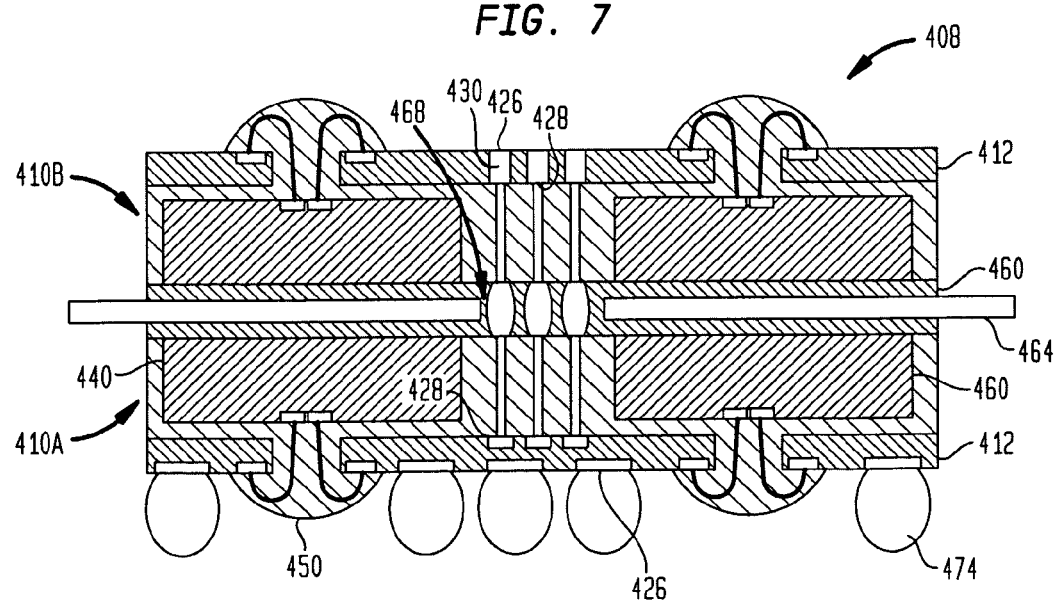
FIG. 7 is a further alternative assembly including microelectronic packages of the type shown in FIG. 1.
Figure 11:
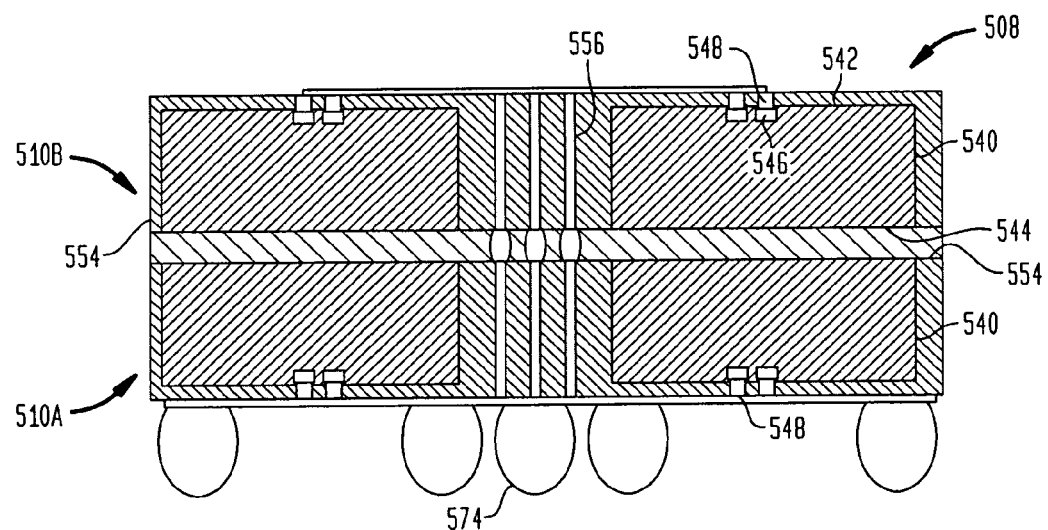
FIG. 11 is an assembly of the type shown in FIG. 6 incorporating microelectronic packages as shown in FIG. 8.
Figure 12:
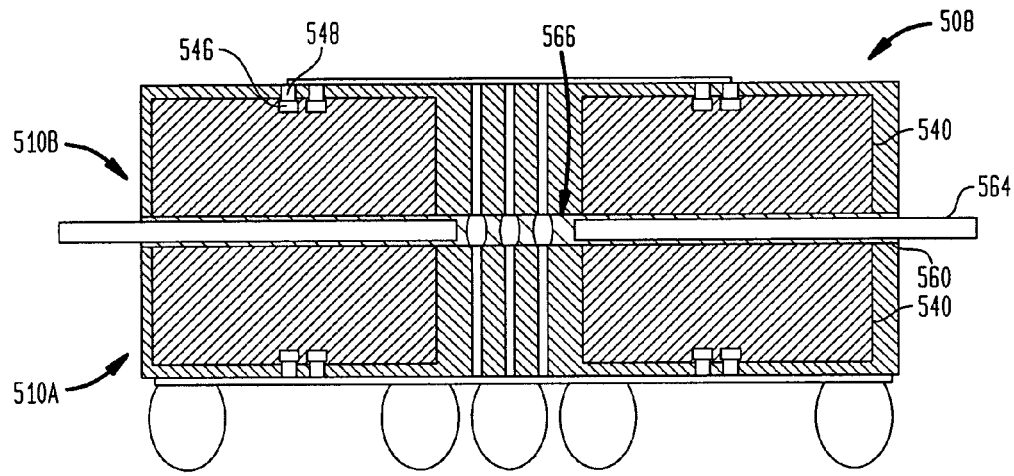
FIG. 12 is an assembly of the type shown in FIG. 7 incorporating microelectronic packages as shown in FIG. 8.

FIGS. 11 and 12 show examples of assemblies 508 that include wafer level packages 510A and 510B in arrangements that are similar to those shown in FIGS. 6 and 7. In particular packages 510A and 510B are assembled face-to-face with solder balls 562 connecting facing and mutually aligned interconnect 556 end surfaces 558. A adhesive layer 560 can attach between facing surfaces 554 of the respective packages 510A and 510B. The embodiment of FIG. 500 incorporates a heat spreader 564 in a similar manner to that of FIG. 7. Multiple sub-assemblies of face-to-face bonded packages can be assembled together, as discussed above.

Figure 13:
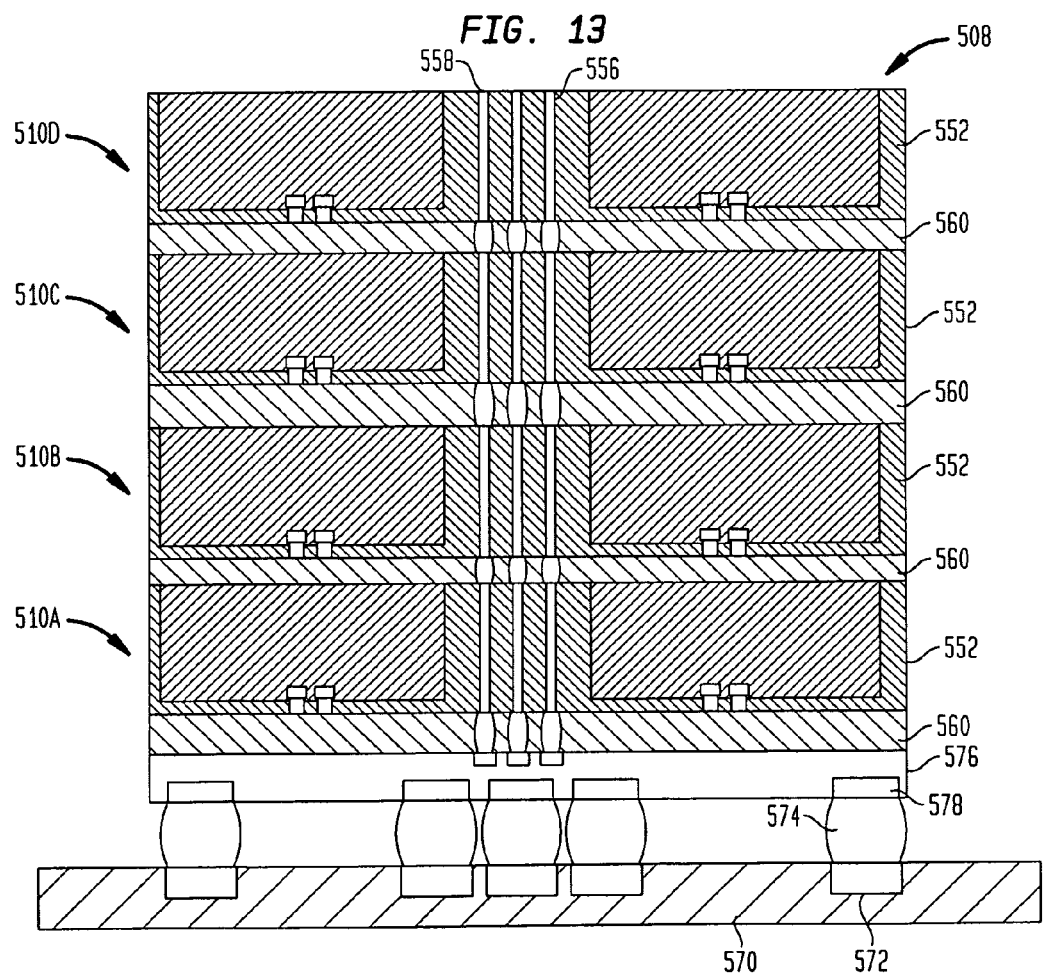
FIG. 13 is a section view of an assembly including additional microelectronic elements of the type shown in FIG. 8.

As shown in FIG. 13, assemblies with additional packages 510C and 510D by continuing to assemble packages on top of each other and connecting adjacent pairs of package terminals 526 and interconnect 556 end surfaces 558 in a similar manner to that discussed with respect to FIG. 2. Even more than the four packages shown in FIG. 13 can be included in such an assembly.

As previously discussed, any of the assemblies discussed above in FIGS. 1-13 can be adapted to include more than two microelectronic elements in each package. FIGS. 14-17 show further examples of an assembly of the type shown in FIG. 8 having four microelectronic elements 640 in each package 610. In particular, FIG. 15 shows a top schematic view of a package 610 that can be used in the assembly of FIG. 14. In this embodiment, microelectronic elements 640 are arranged such that edges 645 are arranged in a square along surface 614 of substrate 612. This arrangement defines interconnect area 618 in the square area defined by edges 645. As in previously-discussed embodiments, stack terminals 628 are arranged in an array on front surface 614 of substrate 612 within interconnect area 618. As discussed previously, package terminals 626 are exposed on back surface 616 of substrate 612 and can directly align with stack terminals 628 or be offset therefrom.

In addition to the interconnect area 618 defined within the four microelectronic elements 640, as shown in FIG. 15, adjacent pairs of microelectronic elements 640 define outer interconnect areas 620 between edges 645 thereof and the boundary of substrate 612. Additional stack terminals 628 can be exposed on front surface 614 of substrate 612 in these outer interconnect areas 620 as well. In the example shown in FIG. 15, four such outer interconnect areas 620 are defined on substrate 612; however, more of fewer outer interconnect areas can be present, depending on the number of microelectronic elements included in a given package.

Figure 14:
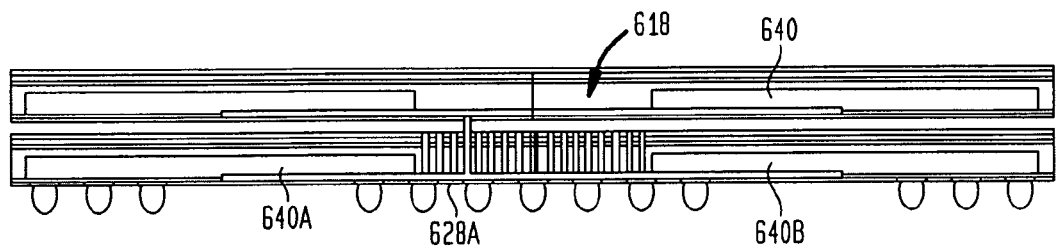
FIG. 14 is a sectional view of an assembly of further alternative microelectronic packages.
Figure 15:
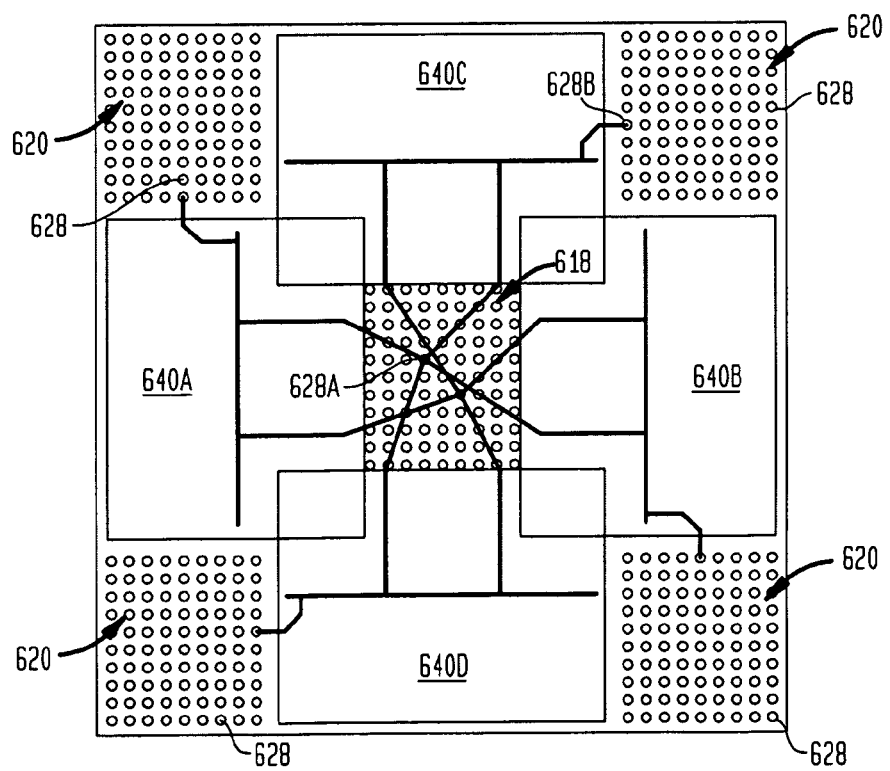
FIG. 15 is a top plan view of a microelectronic package as used in the assembly shown in FIG. 14.

In an assembly 608 of packages 610 of the type shown in FIGS. 14 and 15, the stack terminals 628 within different interconnect areas 618 and 620 can be used to carry different signals, depending on their location or can be interconnected with different combinations of microelectronic elements 640. For example, the stack terminals 628 within interconnect area 618 can be interconnected with more than one of the microelectronic elements 640 to carry common signals to two, three or all of the microelectronic elements 640. As shown in FIG. 15, one such stack terminal 628A can connect with all microelectronic elements 640. In a further example, the stack terminals within outer interconnect area 620 can connect with only one of the microelectronic elements 640 that bound it or with both of the microelectronic elements that bound that particular outer interconnect area 640. In an embodiment, the stack terminals 628C within an outer interconnect area 640 can connect with only the closest one of the microelectronic elements 640C to carry a signal that is specific to that microelectronic element. The remaining stack terminals can be connected with the various microelectronic elements 640 according to this scheme. To do so may be advantageous due to the relative distances between the stack terminals 628 and the microelectronic elements 640 because the stack terminals 628 in the outer interconnect areas 620 can be at too disparate a distance between opposite microelectronic elements (such as microelectronic elements 640A and 640B) to carry common signals. This can be due to the additional time required for such signals to reach the farther of the microelectronic elements 640. Conversely, the stack terminals 628 within interconnect area 618 can be close enough in distance to all microelectronic elements 640 to reliably carry common signals.

In certain embodiments of the invention, the microelectronic elements in the package include microelectronic elements configured to provide memory storage array function. For example, the microelectronic elements can provide dynamic random access memory ("DRAM") function, and may in some cases include or be dedicated DRAM chips. In such case, the stack terminals 628 in the interconnect area may be configured to carry all of a group of command-address bus signals to the second microelectronic package 601B. Packages that have centrally located terminals configured to carry command, address, and timing signals can be as further described in commonly owned U.S. Provisional Patent Application No. 61/506,889 filed Jul. 12, 2011 (the "'889 Application"), U.S. Provisional Patent Application No. 61/542,488 filed Oct. 3, 2011 (the "'488 Application"), and U.S. Provisional Patent Application No. 61/542,553 filed Oct. 3, 2011 (the "'553 Application"), the disclosures of said '889, '488, and '553 Applications being incorporated by reference herein. Typically, the command-address bus signals can be bussed on a circuit panel such as a printed circuit board or module card to multiple microelectronic packages in parallel, particularly to microelectronic packages mounted to the same or to opposite surfaces of the circuit panel. In one example, such a circuit panel can be a motherboard or single-inline memory module or "SIMM" or dual-inline memory module or "DIMM" module board. In a particular example, the command-address bus signal terminals of the interconnect area can be configured to carry all of a group of command signals, address signals, bank address signals and clock signals, wherein the command signals are write enable, row address strobe, and column address strobe, and the clock signals are sampling clocks used for sampling the address signals. While the clock signals can be of various types, in one embodiment, the clock signals carried by these terminals can be one or more pairs of differential clock signals which are received as differential or true and complement clock signals. In yet another example, package terminals aligned with the stack terminals or disposed on the outwardly-facing surface of the substrate will also include command-address bus signal terminals for mating with a circuit panel, or for mating with the stack terminals of a like package.

In one embodiment, the microelectronic package can be functionally equivalent to a SIMM or a DIMM, and the stack terminals in the interconnect area of the package, and the package terminals connected thereto, may be configured to carry all of a group of command-address bus terminals; i.e., all of the command signals, address signals, bank address signals, and clock signals transferred to the package, the command signals being write enable, row address strobe, and column address strobe signals, and the clock signals being sampling clocks used for sampling the address signals. In a particular embodiment, the package may incorporate a buffer element, e.g., an integrated circuit therefor, which is configured to regenerate the command-address bus signals received at the package terminals and transmit the regenerated signals on the stack terminals to additional packages which may be assembled therewith, as also described in the '488 Application. In such case, the microelectronic package may be functionally equivalent to a registered DIMM or "RDIMM". In another example, the microelectronic package may be functionally equivalent to a load-reduced DIMM ("LRDIMM") in which case, the buffer element can be configured to regenerate all of the data signals received by the microelectronic package and transmit the same to one or more additional microelectronic packages assembled therewith.

In a particular example, the microelectronic package can be configured to transfer, i.e., receive by the package, or transmit from the package thirty-two data bits in parallel in a clock cycle. In another example, the microelectronic package can be configured to transfer sixty-four data bits in parallel in a clock cycle. A number of other data transfer quantities are possible, among which only a few such transfer quantities will be mentioned without limitation. For example, the package can be configured to transfer 72 data bits per clock cycle which may include a set of 64 underlying bits which represent data and 8 bits which are error-correction code ("ECC") bits for the 64 underlying bits. Ninety-six data bits, 108 bits (data and ECC bits), 128 data bits and 144 bits (data and ECC bits) are other examples of data transfer widths per cycle that the microelectronic package may be configured to support.

Figure 16:
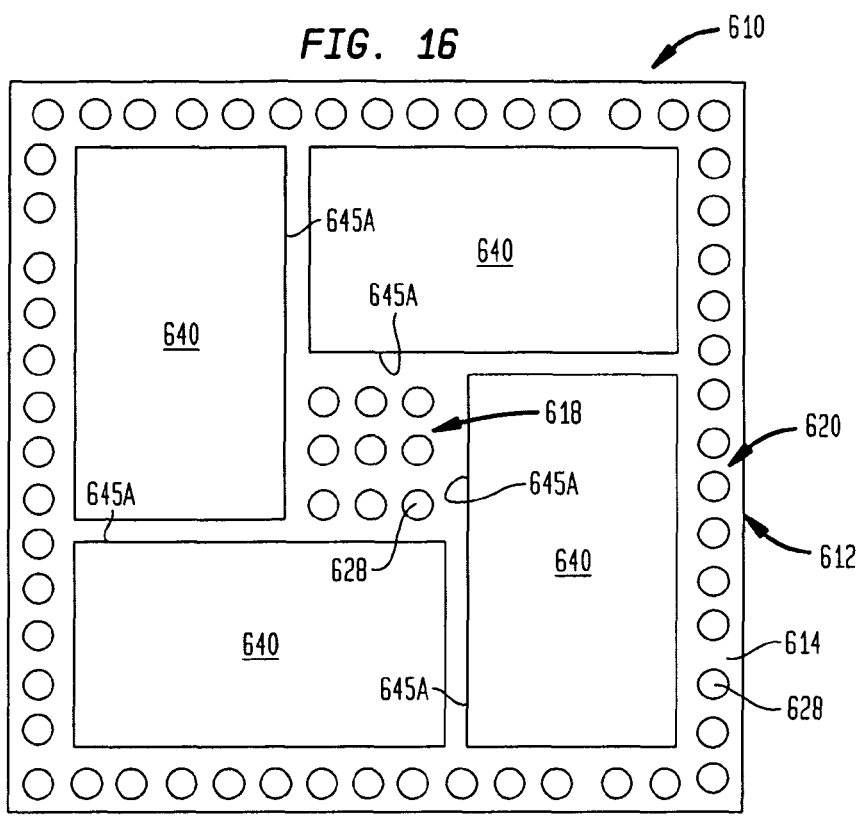
FIGS. 16 and 17 are top plan views of alternative microelectronic packages that can be used in the assembly shown in FIG. 14.
Figure 17:
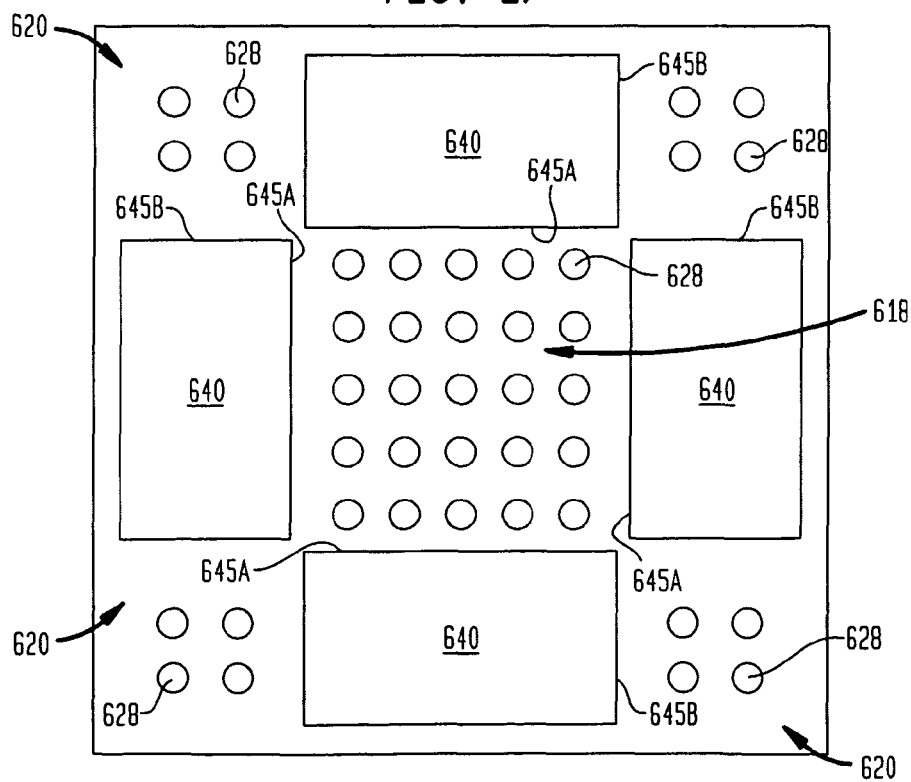

FIGS. 16 and 17 show additional examples of how microelectronic elements 640 can be arranged in a four microelectronic element package 610. In FIG. 16, the microelectronic elements 640 are staggered and do not overlap (as they do in FIG. 15), which eliminates the outer interconnect areas 620. In particular, the microelectronic elements 640 in the arrangement of FIG. 16 can be described as having inside edge surfaces 645A extending along a plane that intersects an adjacent inside edge surface 645A of another microelectronic element 640. In this an embodiment, stack terminals 628 within interconnect area 618 can carry both common and specific signals. As shown in FIG. 16, substrate 612 can extend outside of the areas that microelectronic elements 640 overlie to define a continuous outer interconnect area 620 surrounding the microelectronic elements 640 and including stack terminals 628 therein. These stack terminals 628 can connect with adjacent microelectronic elements to carry signals specific to that element with common signals carried by stack terminals 628 within the interconnect area 618 surrounded by the microelectronic elements 640.

In FIG. 17 a non-overlapping arrangement of microelectronic elements 640 is shown that, as in the embodiment of FIG. 15, defines outer interconnect areas 620 having stack terminals 628 therein. In such an arrangement, inside edge surfaces 645A extend along planes such that each microelectronic element 640 is positioned between two such planes defined by inside edge surfaces 645A of adjacent microelectronic elements 640. As used herein, "between" can include an arrangement where a microelectronic element is tangent to such a plane.

Figure 18:
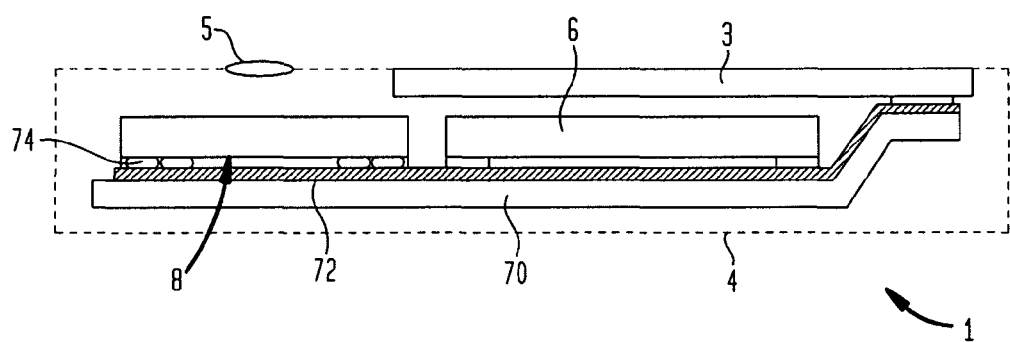
FIG. 18 shows a system including a microelectronic assembly according to an embodiment of the present disclosure.

Various embodiments of the connection components described herein can be used in connection with various diverse electronic systems. The interconnection components described above can be utilized in construction of diverse electronic systems, as shown in FIG. 18. For example, a system 1 in accordance with a further embodiment of the invention can include a microelectronic assembly 8, being a unit formed by assembly of microelectronic packages 10A and 10B, similar to the microelectronic assembly 8 shown in FIG. 1. The embodiment shown, as well as other variations of microelectronic assemblies, as described above can be used in conjunction with other electronic components 6 and 3. In the example depicted, component 6 can be a semiconductor chip or package or other assembly including a semiconductor chip, whereas component 3 is a display screen, but any other components can be used. Of course, although only two additional components are depicted in FIG. 18 for clarity of illustration, the system may include any number of such components. In a further variant, any number of microelectronic assemblies including a microelectronic element and an interconnection component can be used. The microelectronic assembly and components 6 and 3 are mounted in a common housing 4, schematically depicted in broken lines, and are electrically interconnected with one another as necessary to form the desired circuit. In the exemplary system shown, the system includes a circuit panel 70 such as a flexible printed circuit board, and the circuit panel includes numerous conductors 72 interconnecting the components with one another.

However, this is merely exemplary; any suitable structure for making electrical connections can be used, including a number of traces that can be connected to or integral with contact pads or the like. Further, circuit panel 70 can connect to assembly 8 using solder balls 74 or the like. The housing 4 is depicted as a portable housing of the type usable, for example, in a cellular telephone or personal digital assistant, and screen 3 is exposed at the surface of the housing. Where system 1 includes a light-sensitive element such as an imaging chip, a lens 5 or other optical device also may be provided for routing light to the structure. Again, the simplified system 1 shown in FIG. 18 is merely exemplary; other systems, including systems commonly regarded as fixed structures, such as desktop computers, routers and the like can be made using the structures discussed above.

Although the description herein has been made with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A microelectronic assembly, comprising:
a first microelectronic package and a second microelectronic package overlying the first microelectronic package, each of the first and second microelectronic packages including:
a substrate having first and second opposed surfaces, apertures extending between the first and second opposed surfaces, substrate contacts disposed at the first surface, and an interconnect area disposed at the first surface;
first and second microelectronic elements each having element contacts facing the apertures and electrically connected with corresponding substrate contacts disposed at the first surface, the first and second microelectronic elements being spaced apart from one another by the interconnect area;
a dielectric layer overlying the first and second microelectronic elements and the interconnect area;
a plurality of package terminals at the second surface electrically interconnected with the substrate contacts for connecting the package with a component external to the package;
a plurality of stack terminals disposed at the first surface and positioned within the interconnect area electrically connected with the package terminals;
wherein conductive interconnects extend through the dielectric layer disposed within the interconnect area, the conductive interconnects being joined to the stack terminals of the first microelectronic package and the stack terminals of the second microelectronic package.

2. The microelectronic assembly of claim 1, wherein each of the microelectronic elements includes a peripheral edge adjacent to the interconnect area such that the interior interconnect area is defined as a rectangular area.

3. The microelectronic assembly of claim 1, wherein the interconnect elements are selected from the group comprising pins, posts, masses of a conductive material.

4. The microelectronic assembly of claim 1, wherein conductive leads extend from the contacts of the respective first and second microelectronic elements of the first and second microelectronic packages through the respective apertures.

5. The microelectronic assembly of claim 1, wherein the dielectric encapsulant includes a first surface and a second surface, the first surface being flush with respective rear surfaces of the first and second microelectronic elements.

6. A microelectronic assembly, comprising:
first and second microelectronic packages, each of the first and second microelectronic packages including:
a substrate having first and second opposed surfaces, apertures extending between the first and second opposed surfaces, substrate contacts disposed at the first surface, and an interconnect area disposed at the first surface;
first and second microelectronic elements each having element contacts facing the apertures and electrically connected with corresponding substrate contacts on the first surface, the first and second microelectronic elements being spaced apart from one another on the first surface and bounding the interconnect area;
a plurality of contact pads having surfaces exposed at the second surface of the substrate, the surfaces of the contact pads defining package terminals electrically interconnected with the substrate contacts for connecting the package with a component external to the package; and
a molded encapsulant layer overlying at least a portion of the first surface of the substrate and defining an encapsulant surface;
wherein the second microelectronic package is bonded to the encapsulant surface of the first microelectronic package, the second microelectronic package including terminals facing the encapsulant surface;
a plurality of first conductive vias extending at least through the molded encapsulant layer of the first microelectronic package and connecting the contact pads of the first microelectronic package and the terminals of the second microelectronic package;
a plurality of second conductive vias extending at least through the molded encapsulant layer of the second microelectronic package, the second conductive vias having a first end adjacent the contact pads of the second microelectronic package and a second end adjacent the encapsulant surface of the second microelectronic package; and
a conductive bonding material disposed between the first and second conductive vias and electrically connecting the first and second microelectronic packages.

7. The assembly of claim 6, wherein the second surface of the substrate of the second microelectronic package is bonded to the encapsulant surface of the first microelectronic package, wherein the terminals of the second package are surfaces of conductive pads exposed at the second surface of the substrate, and wherein the second conductive vias further extend through the conductive pads of the second package in electrical contact therewith.

8. The assembly of claim 6, wherein the first conductive vias further extend through the contact pads of the first package in electrical contact therewith.

9. A microelectronic assembly, comprising:
a first microelectronic package, including:
a substrate having first and second opposed surfaces and substrate contacts thereon;
first and second microelectronic elements each having element contacts electrically connected with the substrate contacts, the first and second microelectronic elements being spaced apart from one another on the first surface so as to provide an interconnect area of the first surface between the first and second microelectronic elements;
a plurality of package terminals at the second surface electrically interconnected with the substrate contacts for connecting the package with a component external to the package; and
a plurality of stack terminals exposed at the first surface in the interconnect area for connecting the package with a component overlying the first surface of the substrate; and
a second microelectronic package overlying the first microelectronic package and having terminals joined to the stack terminals of the first microelectronic package,
first and second heat spreaders disposed between the first and second microelectronic packages, the first heat spreader being disposed on a first side of the interconnect area and the second heat spreader being disposed on a second side of the interconnect area with a gap being defined between the first and second heat spreaders, the stack terminals of the second microelectronic package being electrically connected with the stack terminals of the first microelectronic package through the gap.

10. The microelectronic assembly of claim 9, wherein additional ones of the stack terminals are at the first surface of the substrate in a portion thereof that is outside of the interconnect area.

11. The microelectronic assembly of claim 10, wherein at least some of the stack terminals are connected with both of the first and second microelectronic elements.

12. The microelectronic assembly of claim 11, wherein at least some of the stack terminals that are connected with both of the first and second microelectronic elements are configured to carry at least one of command, address, and timing signals.

13. The microelectronic assembly of claim 9, wherein the first microelectronic package further includes a molded encapsulant layer overlying at least a portion of the first surface of the substrate, and wherein at least portions of the first conductive interconnects comprise first conductive vias extending through the molded encapsulant layer to exposed ends.

14. The microelectronic assembly of claim 9, wherein contact-bearing faces of the first and second microelectronic elements face the substrate, the substrate contacts including substrate contacts exposed at the second surface, and wherein the element contacts are connected with the substrate contacts by wire bonds.

15. The microelectronic assembly of claim 9, including substrate contacts exposed at the first surface and wherein the element contacts of the first and second first microelectronic elements face the substrate contacts exposed at the first surface and are joined thereto.

16. The microelectronic assembly of claim 9, wherein the second microelectronic package includes a third microelectronic element mounted on a second substrate, the terminals being on the second substrate and electrically connected with the third microelectronic element.

17. The microelectronic assembly of claim 9, wherein the second microelectronic package includes a substrate having first and second spaced apart surfaces and third and fourth microelectronic elements mounted on the second surface thereof, the third and fourth microelectronic elements being spaced apart on the substrate of the second package to define an interconnect area therein, and the terminals being exposed at the second surface of the substrate of the second package within the interconnect area, the substrate of the second package further including a window extending therethrough between the first and second surfaces thereof, and wherein the terminals of the second package are joined to the stack terminals of the first package by wire bonds that extend through the window.

18. The microelectronic assembly of claim 17, wherein the substrate of the first package defines a peripheral area surrounding at least one of the first and second microelectronic elements, additional stack terminals being located in the peripheral area, wherein the substrate of the second package defines a peripheral area surrounding at least one of the third and fourth microelectronic elements and a peripheral edge bounding the peripheral area, additional terminals being located in the peripheral area thereof, and wherein at least some of the additional stack terminals of the first package are joined with at least some of the additional terminals of the second package by wire bonds that extend past the peripheral edge of the substrate of the second package.

19. The microelectronic assembly of claim 9, further including a circuit panel with circuit contacts exposed at a surface thereof, wherein the package terminals of the first microelectronic package are electrically connected with the circuit contacts.

20. The microelectronic assembly of claim 9, wherein the first and second microelectronic packages are joined together by an adhesive layer, and wherein the conductive masses extend through the adhesive material.

* * * * *